United States Patent [19]

Kitano et al.

[11] Patent Number: 5,101,263
[45] Date of Patent: Mar. 31, 1992

[54] SEMICONDUCTOR DEVICE AND METHOD FOR MANUFACTURING THE SAME

[75] Inventors: Makoto Kitano; Chikako Kitabayashi, both of Ibaraki; Asao Nishimura, Ushiku; Hideo Miura, Ibaraki; Akihiro Yaguchi, Ibaraki; Sueo Kawai, Ibaraki, all of Japan

[73] Assignee: Hitachi, Ltd., Tokyo, Japan

[21] Appl. No.: 541,220

[22] Filed: Jun. 21, 1990

Related U.S. Application Data

[63] Continuation of Ser. No. 353,478, May 18, 1989, abandoned.

[30] Foreign Application Priority Data

May 20, 1988 [JP] Japan .................. 63-121778

[51] Int. Cl.⁵ .................. H01L 23/28; H01L 23/48; H01L 23/46
[52] U.S. Cl. .................. 357/72; 357/68
[58] Field of Search .................. 357/65, 68, 72; 228/4.5, 179, 110

[56] References Cited

FOREIGN PATENT DOCUMENTS

| | | | |
|---|---|---|---|
| 0142447 | 5/1985 | European Pat. Off. | 357/67 |
| 2824607 | 12/1978 | Fed. Rep. of Germany | 357/68 |
| 52-19971 | 2/1977 | Japan | 357/68 |
| 54-22770 | 2/1979 | Japan | 357/68 |
| 59-104147 | 6/1984 | Japan | 357/68 |
| 61-210646 | 9/1986 | Japan | 357/68 |

OTHER PUBLICATIONS

T. H. Ramsey, "Metallurgical Behavior of Gold Wire in Thermal Compression Bonding", Solid State Tech., Oct. 1973, pp. 43-47.

*Primary Examiner*—Andrew J. James
*Assistant Examiner*—Don Monin
*Attorney, Agent, or Firm*—Antonelli, Terry, Stout & Kraus

[57] ABSTRACT

In a plastic encapsulated semiconductor device, a part of wire piece may break down due to thermal fatigue, which positioned adjacent to a bonding portion of the wire piece connected to a chip. This is caused by that wire piece moves relative to plastic encapsulating the chip and the wire piece, and a strain in the wire piece due to thermal deformation of the device concentrates on one portion of the wire piece. Accordingly, a rugged portion is formed on a surface of a part of wire piece subjected to a breakdown to thermal fatigue. The plastic bites recesses of the rugged portion to prevent the wire piece from moving relative to the plastic, thereby preventing the wire piece from breaking down due to thermal fatigue.

8 Claims, 6 Drawing Sheets

HEATING TEMPERATURE (°C)

SEMICONDUCTOR DEVICE AND METHOD FOR MANUFACTURING THE SAME

This application is a continuation application of application Ser. No. 07/353,478, filed May 18, 1989 now abandoned.

FIELD OF THE INVENTION AND RELATED ART STATEMENT

The present invention relates to a plastic encapsulated semiconductor device, and more particularly to a plastic encapsulated semiconductor device which can advantageously prevent wires connected to a chip from breaking down due to thermal fatigue. The present invention also relates to a method for manufacturing such semiconductor device.

The plastic encapsulated semiconductor device generally consists of a chip, a lead frame having a chip pad portion on which the chip is mounted and a lead portion, wire pieces connecting the chip to the lead portion, and plastic for encapsulating the aforementioned members. These members have different coefficients of linear expansion. For example, the chip has a coefficient of linear expansion of about $3 \times 10^{-6}$ (1/° C.) and the plastic has that of about $20 \times 10^{-6}$ (1/° C.). The difference in the coefficients of linear expansion causes a thermal stress in the respective members when the temperature of the semiconductor device varies. On temperature change, the wire pieces are subjected to the thermal stress and then may finally break down due to the thermal fatigue thereof. As will be described in details later, in particular, in case that there occurs a slip or a relative displacement between the wire piece and the plastic, the wire piece is subjected to a larger thermal stress and then may readily break down.

The countermeasure for preventing the wire piece from moving relative to the plastic is disclosed, for example, in JP-A-61-152030. In this countermeasure, the wire piece is coated with metal oxide to improve the adhesiveness to plastic. For the other purpose, another publication, JP-A-61-101038, discloses a countermeasure, for preventing the wire movement. In this countermeasure, a plurality of fine wires are twisted together into a twist wire having a rugged surface. The plastic bites the rugged surface of the twist wire so as to prevent it from moving relative to the plastic.

The first countermeasure can be applicable to an oxidative metal wire, e.g. a copper wire, but not applicable to a gold wire which is generally used in such device. Furthermore, the adhesiveness between the metal oxide and the plastic doesn't have a sufficient strength for preventing the relative movement between the plastic and the wire piece.

It is hard for the second countermeasure to twist a plurality of fine wires into a twist wire. The second countermeasure needs a special bonding machine suitable therefor. Accordingly the second countermeasure has not been practical yet.

OBJECT AND SUMMARY OF THE INVENTION

An object of the present invention is to provide a plastic encapsulated semiconductor device in which the relative movement between the plastic and the wire piece is prevented readily by means of practical arts, whereby preventing the wire piece from breaking down due to thermal fatigue.

To this end, according to the present invention, a longitudinal series of rugged portions is provided at an outer surface of a part of the wire piece adjacent to a bonding portion of the chip, which part is susceptible to thermal fatigue. Therefore, the plastic can bite the rugged surface of the wire piece so as to prevent it from slipping. Namely, the present invention provides a plastic encapsulated semiconductor device comprising a chip, a lead frame, a plurality of wire pieces for electrically connecting the semiconductor element to the lead frame, each of which has a rugged portion at a part thereof adjacent to a bonding portion where the wire piece is bonded to the chip, and plastic for encapsulating the aforementioned members.

The rugged portion of the wire surface includes, for example, dimples formed on the wire surface. The present invention is particularly effective against the gold wire. It is preferable that the end portion of the wire piece to be bonded to the bonding portion of the chip is bulb, and the rugged surface of the wire piece extends from a top of the bulb of the wire piece to a part thereof away from the top by 0.2 mm or more. Furthermore a depth of the rugged surface is preferably about 8% to 12% of the diameter of the wire piece.

According to the another aspect of the present invention, it is preferable that wire clamping means having clamping surfaces provided with rugged surfaces is prepared for transferring the rugged pattern to the surface of a part of the wire piece and the wire piece is so supplied towards the chip that the transferred rugged surface part is positioned adjacent to the bonding portion of the chip. Namely, the present invention provides a method for manufacturing a semiconductor device comprising a step for positioning a chip on a lead frame, a step for connecting the chip to the lead frame through wire pieces, and a step for encapsulating the aforementioned members with plastic. The connecting step is characterised by the following steps, i.e. a step for clamping a wire to provide a surface of a part thereof with a rugged portion, a step for heating an end of the wire so as to form a bulb end, a step for bonding the bulb end of the wire to a predetermined position of the chip, a step for drawing out the wire to a predetermined position of the lead frame, a step for pressure contact bonding a part of the wire onto the predetermined position of the lead frame, and a step for selectively repeating the aforementioned steps.

According to the present invention, it is possible to prevent the wire piece used in the plastic encapsulated semiconductor device from breaking down due to the thermal fatigue, thereby improving a reliability of the semiconductor device.

The meritorious advantages of the present invention will be more apparent from the following description of preferred embodiments taken into connection with the accompanying drawings.

DETAILED DESCRIPTION OF PREFERRED EMBODIMENTS

Figure 1:
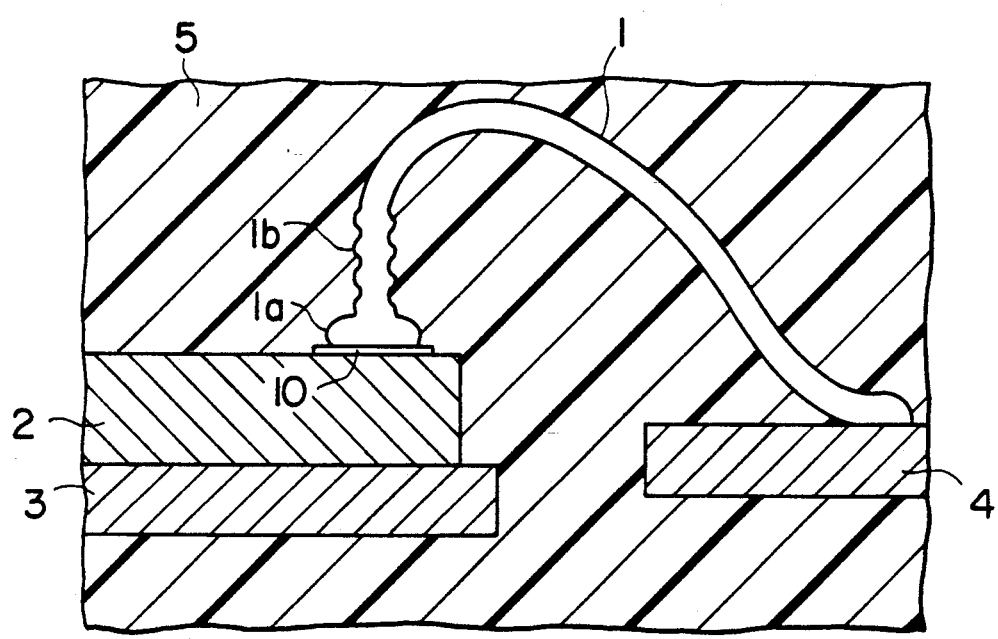
FIG. 1 is a fragmentary enlarged sectional view showing a semiconductor device according to the first embodiment of the present invention.

As shown in FIG. 1, a plastic encapsulated semiconductor device comprises a chip 2, a lead frame having a chip pad portion 3 on which the chip 2 is mounted and a lead portion 4 (only one is shown), and gold wire pieces 1 (only one is shown) in contact with an electrode 10 of the chip 2 through bonding portions 1a thereof and connecting the chip 2 to the lead portions 4. Plastic 5 encapsulates the aforementioned members 1 to 4 and 10 to form a plastic package. Each wire piece 1 is provided at a surface of a portion thereof with as rugged portion 1b, which is positioned away from a top of the bonding portion 1a by a predetermined distance. Since the plastic 5 bites recesses of the rugged portion 1b, there occurs no relative movement between the wire piece 1 and the plastic 5 even though adhesion is insufficient. As a result of this, the strain due to thermal deformation of plastic 5 is distributed uniformly along the wire piece 1 so that no strain concentration in the wire piece occurs, thereby avoiding the breakdown of the wire piece 1 due to thermal fatigue.

Incidentally, in this embodiment, a height of the bonding portion 1a is about 0.05 mm; a distance between the bonding portion and the rugged portion is about 0.2 mm; a diameter of the wire piece 1 is between 25 $\mu$m and 32 $\mu$m; and the wire piece 1 is made of gold.

Figure 11:
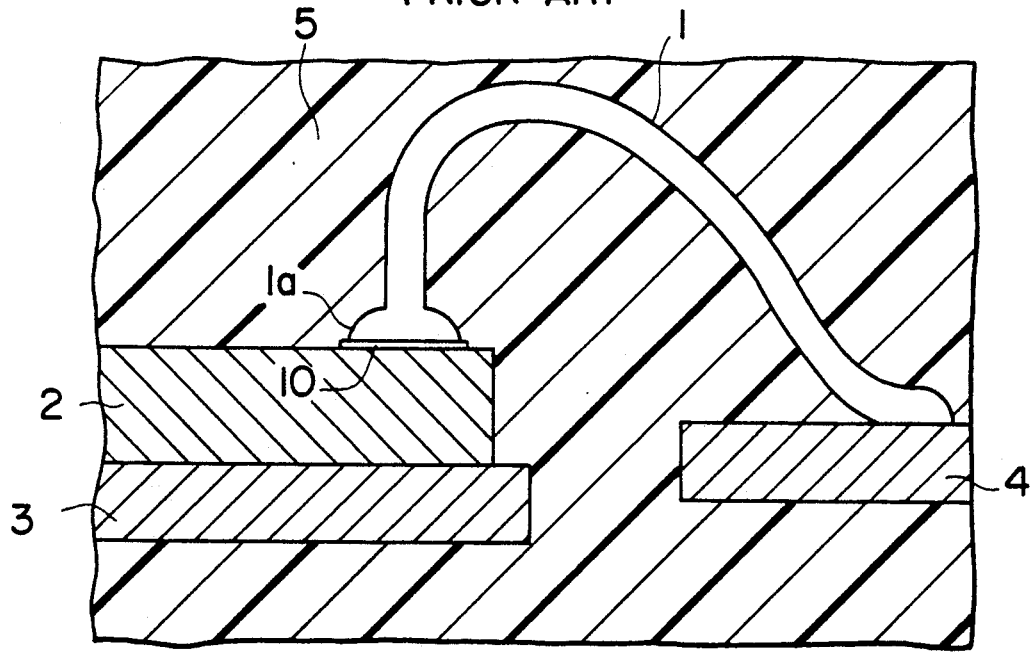
FIGS. 11 and 12 are fragmentary enlarged sectional views showing the semiconductor device manufactured by the prior art.
Figure 12:
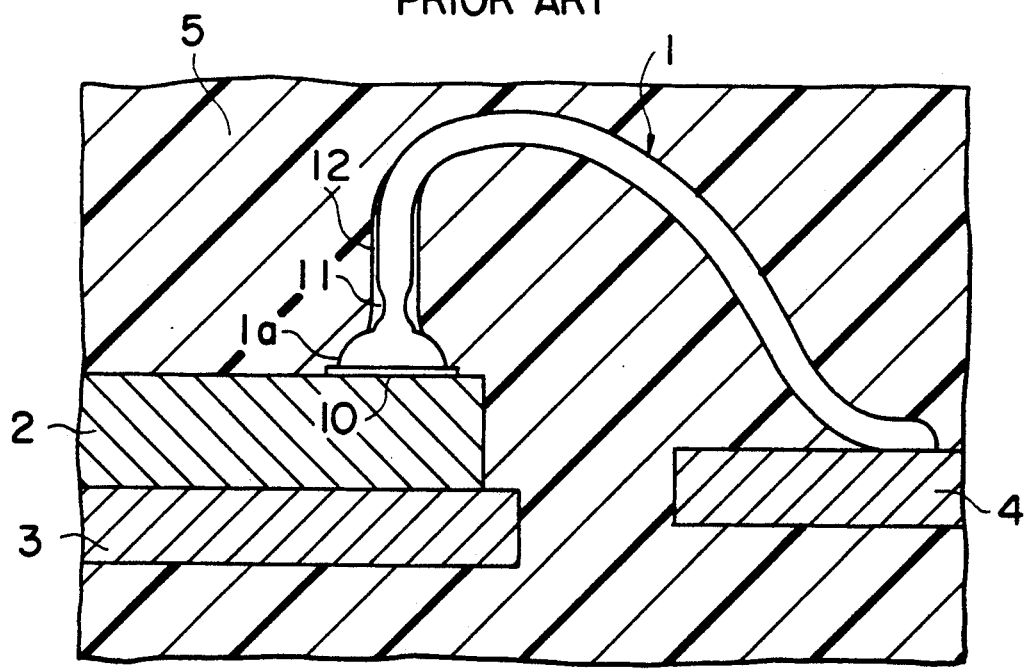

To the contrary, in the prior art device, as shown in FIG. 11, a gold wire piece 1 with an even surface is in contact with an electrode 10 of a chip 2 through a bonding portion 1a thereof. When the package is heated, thermal strain occurs in the wire 1 due to extension thereof. If there is no relative movement between the wire piece 1 and the plastic 5, since the thermal strain of the wire piece 1 is uniform over the length of the wire piece 1, the thermal strain in the wire piece 1 due to such deformation is not serious. However, in case that adhesion is insufficient and the plastic 5 separates from the wire piece 1 to provide a gap 12 therebetween as shown in FIG. 12, this gap 12 permits the wire piece 1 to move relative to the plastic 5 and the thermal strain in the wire piece 1 is not uniform along the wire piece 1, whereby such strain concentrates on a wire portion 11 adjacent to the bonding portion 1a.

The reason why such strain concentration occurs is considered as follows.

Figure 13:
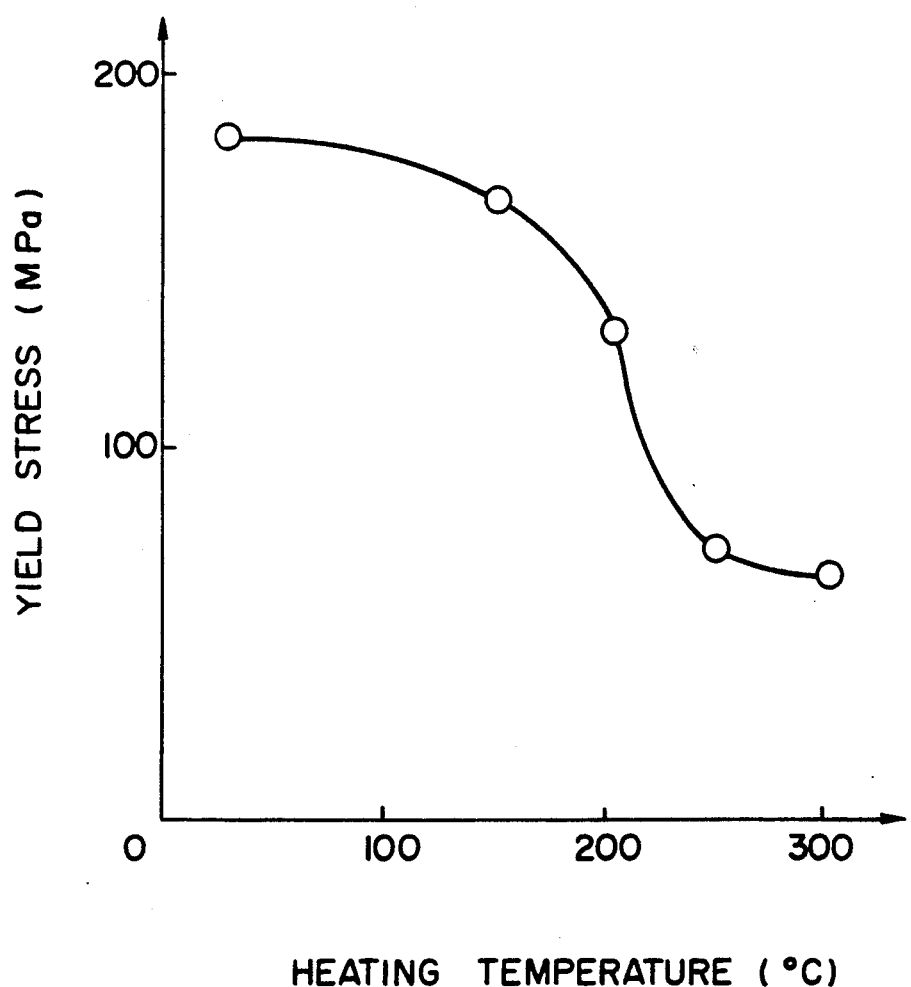
FIG. 13 is a graph showing a relationship between heating temperature and yield stress of the wire.

On the occasion of bonding wire onto the chip, using an electric torch or other heating device, the wire end is heated and melted to form a bulb end in advance. From this, a wire portion adjacent to the bulb end is subjected to high temperature which causes the crystal grain size thereof to become coarse to decrease the yield stress of the wire piece. As apparent from FIG. 13, the experiments show that the yield stress of the wire falls to a half of an initial yield stress when the wire piece is heated to 250° C. or more. If the wire piece having such reduced yield stress is displaced, the strain concentrates on a wire portion which has a lower yield stress and which is adjacent to the top of the bulb end. Therefore, in case that a relative movement between the wire piece and the plastic occurs in the plastic device as shown in FIG. 12, the thermal strain occurs in a portion of the wire piece due to changes of temperature of the plastic package, so that the wire piece readily breaks down due to thermal fatigue thereof.

The shapes of the rugged surface of the wire piece used in the plastic device according to other embodiments of the present invention will be described hereinunder with reference to FIGS. 2 to 4.

Figures 2, 3, 4:
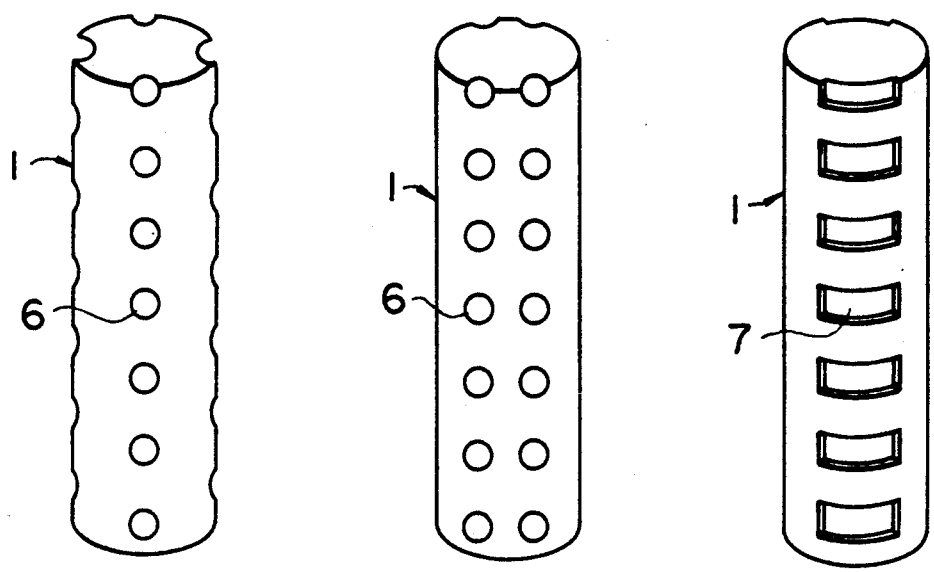
FIGS. 2 to 4 are fragmentary enlarged perspective views showing wire pieces used in other embodiments of the present invention, respectively.

In the wire piece 1 shown in FIG. 2, a plurality of rows of dimples 6 are provided in a surface of the wire piece 1. The plastic bites the dimples 6 to prevent the wire piece from moving relative to the plastic.

In the wire piece 1 shown in FIG. 3, two longitudinal rows of dimples 6 are provided only on diametrically opposite sides of a wire surface, respectively. These dimples 6 can be readily formed on the wire surface by drawing the wire through a pair of rollers, an outer surface of each of which rollers is provided with two longitudinal rows of semispherical projections.

The wire piece 1 shown in FIG. 4 has a pair of rows of grooves 7 disposed on diametrically opposite sides of a wire surface These grooves 7 can also be readily formed by the same way as the dimples 6 of FIG. 3. These grooves 7 may be provided on the wire surface throughout and be disposed in spiral patterns.

Next, a method for manufacturing the semiconductor device according to the present invention will be described hereinunder with reference to FIGS. 5 to 10.

Figure 7:
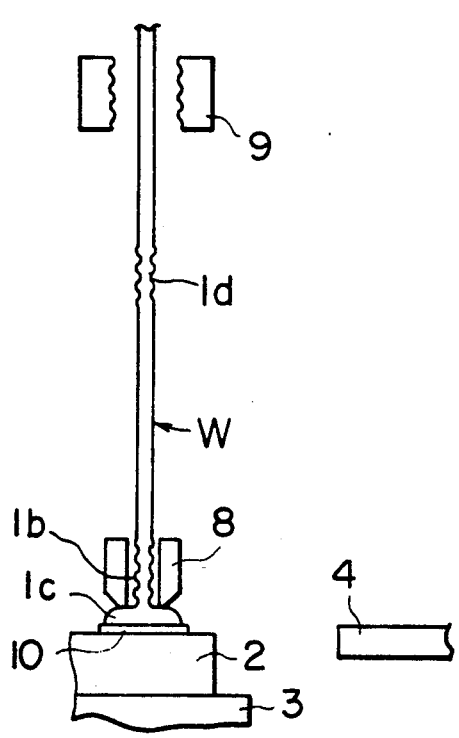
FIGS. 7 to 10 are illustrations showing a wire bonding procedure by means of the bonding machine shown in FIG. 5.

At first, a bulb end 1c of the wire W is positioned above an electrode pad 10 on a chip 2 by means of movement of a capillary tube 8 through which the wire W passes. The bulb end 1c is brought into pressure contact with the electrode pad 10 (FIG. 7). The wire W has two rugged surface portions 1b and 1d, one 1b adjacent to the top of the bulb 1c and the other 1d apart from the one 1b.

Figure 8:
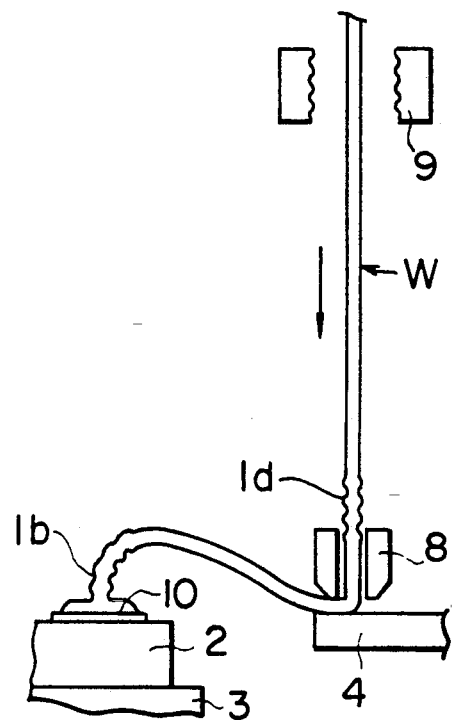

Thereafter, the wire W is drawn to the lead portion 4 by means of movement of the capillary tube 8 and is brought into pressure contact with the lead portion 4 (FIG. 8). This positions the other rugged surface portion 1d immediately above the capillary tube 8.

Figure 9:
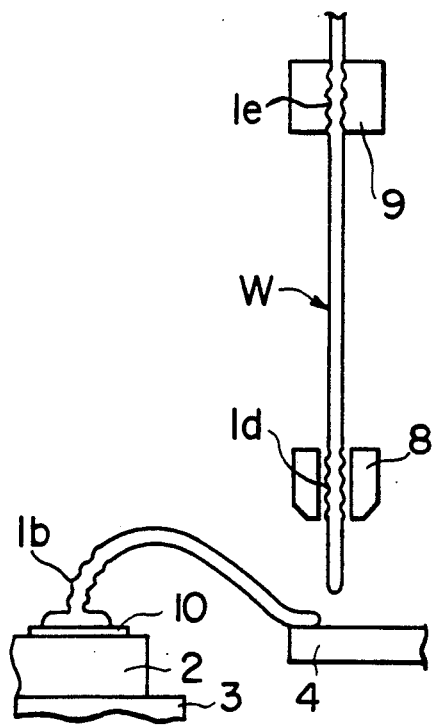

The wire W is cut to connect the chip 2 to the lead portion 4 through a wire piece 1 after the pressure contact. The clamping apparatus 9 clamps the wire to form a new rugged surface portion 1e thereon and pulls up the wire W. The capillary tube 6 is also pulled up to hold the rugged surface portion 1d (FIG. 9).

Figure 10:
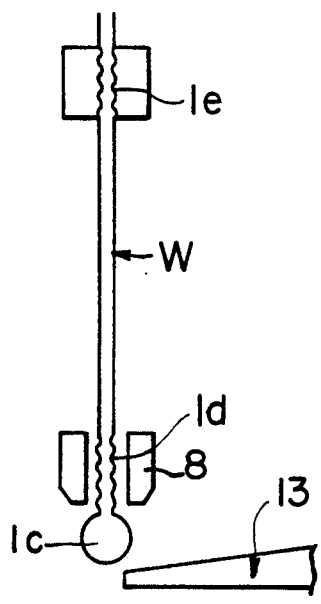

A wire end is heated and melted by an electric torch 13 to form a new bulb end 1c (FIG. 10).

The chip 2, the lead frame and the wire W are encapsulated by the plastic 5 after the aforementioned steps are repeated to complete the wiring between the chip 2 and the lead portion 4 of the lead frame.

Figure 5:
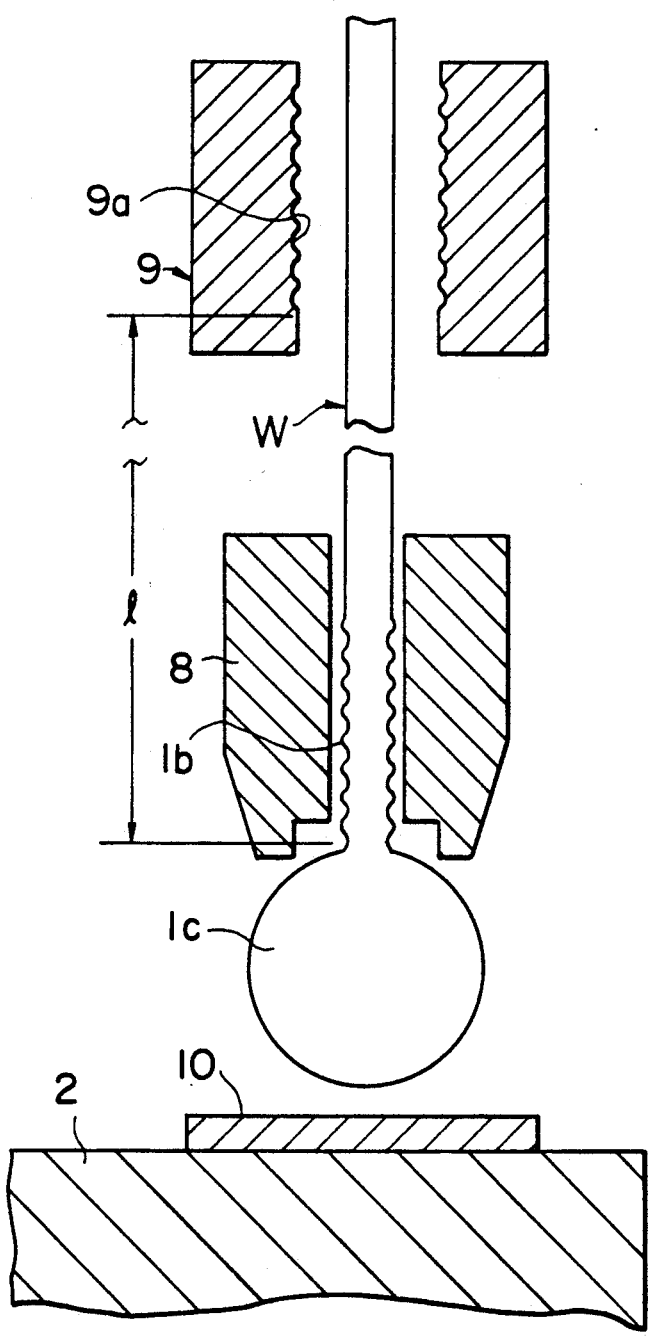
FIG. 5 is a fragmentary enlarged sectional view showing a wire bonding machine used in a manufacturing method according to the another embodiment of the present invention.

The operation of the clamping apparatus 9 will be described hereinunder in more detail with reference to FIGS. 5 and 6.

Figure 6:
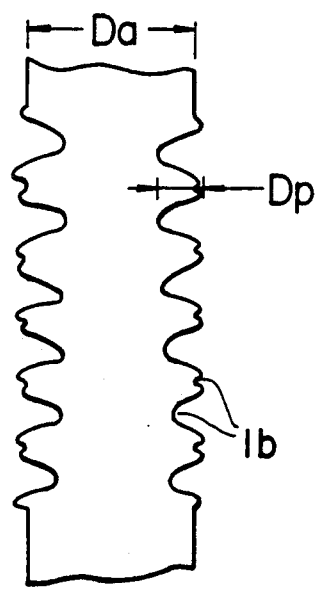
FIG. 6 is a fragmentary view showing the wire surface of the wire processed by the wire bonding machine shown in FIG. 5.

The clamping apparatus 9 has a clamping surface 9a with a rugged portion The clamping apparatus 9 clamps the wire W, so that the rugged portion on the clamping surface 9a is transferred to a surface of the wire W, thereby the rugged portion is formed on the surface of the wire W (FIG. 6). The clamping apparatus 9 is so positioned that a length 1 along the wire W from the top of the bulb end 1c to a lower edge of the clamping surface 9a is equal to or an integral times of the sum of a wire length required to form the bulb end 1c and a wire length required to connect the chip 2 to the lead portion 4. Consequently, the rugged portion is always positioned immediately above the bulb end 1c.

The clamping apparatus 9 can prevent the wire piece from breaking down due to thermal fatigue regardless of the material of a wire. The clamping apparatus 9 may have an elongated clamping surface 9a, thereby forming the rugged portion on a wire surface throughout a whole length of the wire W. The clamping apparatus used in a conventional wire bonding machine can be used as the clamping apparatus 9. Further, it is possible to use a plurality of clamping apparatus to control the shape of the rugged portion. For example, in case that it is required to provide a whole surface of a wire with rugged portions, a first clamping apparatus clamps the wire in a first opposite directions to form the rugged portions on first opposite sides of a wire surface, and thereafter a second clamping apparatus clamps the wire in a second opposite directions perpendicular to the first directions to form the rugged portions on second opposite sides of the wire surface which are angularly spaced from the first sides by 90°, thereby providing a whole surface of the wire with rugged portions.

Figure 14:
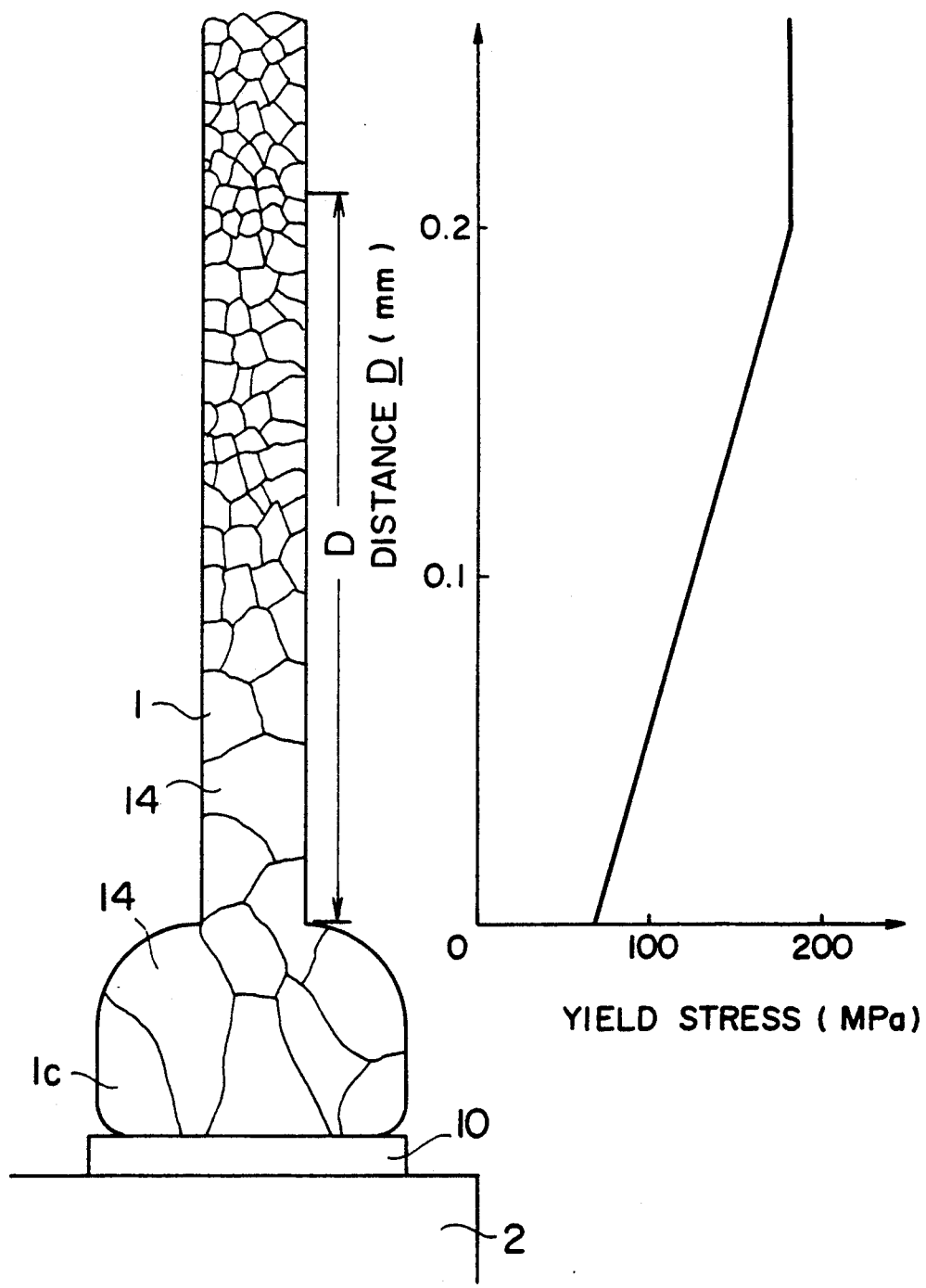
FIG. 14 is a graph showing a distribution of yield stress in a portion of the wire in respect of a distance from the chip.

With reference to FIG. 14, the following explanation is made as to where the rugged portion should be positioned.

In the drawing, the reference numeral 14 designates individual crystal grains of gold. The rugged portion should be formed on a part of wire W apart from the top of the bulb end 1c by a distance D equal to 0.2 mm or more. The reason for this is that the wire part at a distance of 0.2 mm or more from the bulb end 1C is not subjected to a high temperature due to an electric torch upon forming of the bulb end, and the yield stress of such wire part is therefore maintained high and substantially constant.

The depth Dp of the rugged portion is preferably between 8% and 12% of a diameter of the wire W (FIG. 6). The inventors' experiment shows that a depth of the rugged portion must be 8% of a diameter of the wire or more in order to prevent the wire piece from moving relative to the plastic, and that the rugged portion having a depth of 12% of a diameter or more may cause the wire piece to break down. Accordingly, it is understood that the aforementioned depth range is preferable.

We claim:

1. A plastic encapsulated semiconductor device comprising:
    a chip having a plurality of electrodes;
    a lead frame on which said chip is mounted;
    a plurality of wire pieces each having a ball bonding portion in the form of a bulb at a connecting end thereof, said wire pieces being connected to the respective electrodes of said chip by means of the respective ball bonding portions, each of said wire pieces being provided with a rugged surface having recess portions at a part thereof spaced above the top of the bulb of its ball bonding portion by a distance of at least about 0.2 mm so that the recess portions are located in areas of the wire pieces where the yield stress of the wire pieces has not been substantially reduced by heat during ball bonding, and wherein a depth of the recess portions of said rugged surface is at least 8% of a diameter of the associated wire piece; and
    plastic for encapsulating said aforementioned members, said plastic filling said recess portions of the rugged surfaces of said wire pieces.

2. A semiconductor device according to claim 1, wherein said recess portions in each of said wire pieces are located in a predetermined arrangement in the surface of the associated wire piece.

3. A semiconductor device according to claim 1, wherein said rugged surfaces of said wire pieces comprise dimples.

4. A semiconductor device according to claim 1, wherein a depth of the recess portions of said rugged surface is between 8% and 12% of a diameter of the associated wire piece.

5. A plastic encapsulated semiconductor device comprising:
    a chip having a plurality of electrodes;
    a lead frame on which said chip is mounted;
    a plurality of wire pieces each having a ball bonding portion in the form of a bulb at a connecting end thereof, said wire pieces being connected to the respective electrodes of said chip by means of the respective ball bonding portions, each of said wire pieces being provided with a rugged surface having recess portions at a part thereof spaced above the top of the bulb of its ball bonding portion by a distance of at least about 0.2 mm so that the recess portions are located in areas of the wire pieces where the yield stress of the wire pieces has not been substantially reduced by heat during ball bonding, and wherein a depth of the recess portions of said rugged surface is at least 8% of a diameter of the associated wire piece; and
    plastic for encapsulating said aforementioned members, said plastic filling said recess portions of the rugged surfaces of said wire pieces, wherein said wire pieces are made of gold.

6. A semiconductor device according to claim 3, wherein said recess portions in each of said wire pieces are located in a predetermined arrangement in the surface of the associated wire piece.

7. A semiconductor device according to claim 5, wherein said rugged surfaces of said wire pieces comprise dimples.

8. A semiconductor device according to claim 5, wherein a depth of the recess portions of said rugged surface is between 8% and 12% of a diameter of the associated wire piece.

* * * * *